United States Patent [19]
Thorsen, Jr. et al.

[11] 3,969,753
[45] July 13, 1976

[54] SILICON ON SAPPHIRE ORIENTED FOR MAXIMUM MOBILITY

[75] Inventors: Arthur C. Thorsen, Jr., Orange County; Arlen J. Hughes, Tustin, both of Calif.

[73] Assignee: Rockwell International Corporation, El Segundo, Calif.

[22] Filed: June 30, 1972

[21] Appl. No.: 267,864

[52] U.S. Cl. ................................. 357/60; 357/4; 357/23; 357/49
[51] Int. Cl.² ..................................... H01L 27/12
[58] Field of Search ................ 317/235 AS, 235 B; 357/60, 23, 4, 49

[56] References Cited
UNITED STATES PATENTS

| | | | |
|---|---|---|---|
| 3,393,088 | 7/1968 | Manasevit et al. | 317/235 AS |
| 3,413,145 | 11/1968 | Robinson et al. | 317/235 AS |
| 3,414,434 | 12/1968 | Manasevit | 317/235 E |
| 3,433,684 | 3/1969 | Zanowick et al. | 317/235 AS |
| 3,476,991 | 11/1969 | Mize et al. | 317/235 AS |
| 3,566,215 | 2/1971 | Heywang | 317/235 |
| 3,603,848 | 9/1971 | Sato et al. | 317/235 AS |
| 3,634,737 | 1/1972 | Maeda et al. | 317/235 AS |

*Primary Examiner*—William D. Larkins
*Attorney, Agent, or Firm*—H. Frederick Hamann; G. Donald Weber, Jr.; Robert Ochis

[57] ABSTRACT

A semiconductor means comprising a substrate base and a piezoresistive film on the substrate wherein the material of the substrate is different in chemical formulation from the film. This results in a film having a high carrier mobility in which a semiconductor device can be oriented so that the direction of current flow in the device is in the direction of greatest carrier mobility. Performance of the device can be further improved when off-axis-symmetry films are formed on certain substrates. The method of formation of these semiconductor means includes determining the high carrier mobility directions by x-ray techniques and orienting the various masks or other means used to infuse the devices with dopant materials so that the device thus formed in the film will take advantage of high carrier mobility direction and hence higher performance semiconductor devices.

1 Claim, 6 Drawing Figures

3,969,753

SILICON ON SAPPHIRE ORIENTED FOR MAXIMUM MOBILITY

UNITED STATES GOVERNMENT INTEREST

The invention herein described was made in the course of or under Contract No. DAAH01-7O-C-1311 of the Advanced Research Project Agency, ARPA Order No. 1585.

BACKGROUND OF THE INVENTION

The present invention relates to a method of improving device performance when a device is fabricated on a semiconductor film of resistivity and mobility, based in the electrical properties in the semiconductor film grown on a substrate of different material.

Prior art has not recognized the benefits that would be derived from orientation of semiconductor devices in semiconductor films in the direction of greatest carrier mobility. Such lack of recognition resulted in semiconductor device fabrication that failed to give optimum performance, for a given combination of film and substrate materials.

SUMMARY OF THE INVENTION

An unusual effect has been found in heteroepitaxial semiconductor films which may hold promise for the improvement or optimization of certain types of semiconductor devices formed in the film. The effect is basically the anisotropy induced in the electrical properties of the semiconductor film due to anisotropic stresses and strains introduced in the film by virtue of the growth process. These anisotropic properties may be exploited when making devices in the films by (1) orienting the device on the film (when the device is formed) to make optimum use of the electrical properties and (2) growing the film in such an orientation so as to improve the film properties (and hence device properties) by taking advantage of the effect of stress and strain on the electrical properties.

Therefore, this invention provides a semiconductor device whose optimum operation depends on carrier mobility achieved by aligning the device so that the current flows therein in a direction parallel to the high carrier mobility direction of the film.

It is an object of this invention to form a semiconductor device in a semiconductor film positioned in a direction so that the current direction flow in the device corresponds to the high mobility direction in the film.

It is another object of this invention to enhance performance of a semiconductive film on an insulating substrate by determining the off-axis symmetry of the film with respect to the substrate where the mobility is optimum.

Hence, in accordance with this invention a semiconductor means is provided, comprising a substrate base and a semiconductor piezoresistive film on the substrate, the material of the substrate and film differing in formulation from each other for producing a stress in the film, the film having a directional carrier mobility therein that may be predetermined by known x-ray techniques. A semiconductor device is then, by known methods, formed in the film and positioned in the film so that the direction of current flow in the device is in the direction of greatest carrier mobility for obtaining improved performance in the film, over prior conventional methods wherein the device is randomly positioned.

Therefore, one form of the invention comprises films, the surfaces of which are high symmetry crystallographic planes, whereas other films have surfaces other than high symmetry crystallographic planes referred to as off-axis symmetry or non-symmetry planes in order to optimize carrier mobility.

In the invention, the stress in the film is thermally induced by the expansion differential between the film and substrate. In other instances, since the film is heteroepitaxially disposed on the substrate and an overlying insulating layer, in the case of a silicon film of silicon dioxide, is attached to the film, the stress in the film may also occur due to the presence of the insulating layer.

A variety of substrate bases may be utilized, such as sapphire, spinel, beryllia, thoria, chrysoberyl or magnesium oxide, as well as others that are possible.

Likewise, a variety of semiconductor film materials may be used, the most common being silicon or germanium, although other semiconductor materials not so common may be utilized. The conventional dopants are used during the process of forming the semiconductive device in the film.

Selection of the plane of the film will define the plane of the substrate, and visa versa, since heteroepitaxial formation of film on substrate is involved. Generally, the Miller indices are used to define the planes.

BRIEF DESCRIPTION OF DRAWINGS

FIG. 7 is a cross-sectional view which represents an MOS device after it had been formed in the film and oriented therein in accordance with this invention to obtain performance due to off-axis symmetry orientation.

EXEMPLARY EMBODIMENT

Introduction

Figure 1:
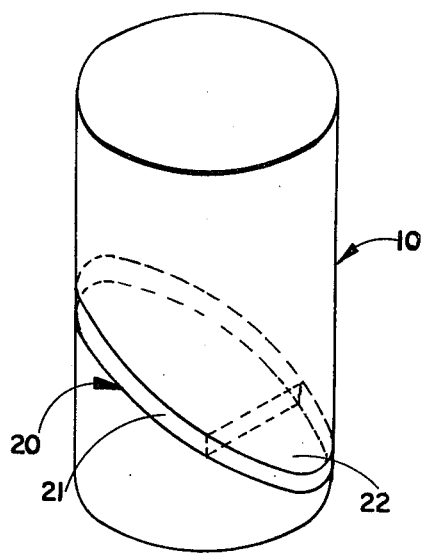
FIG. 1 is a perspective view of a cylinder of sapphire material from which a particular plane of sapphire is selected for use as a substrate base in accordance with this invention.

Measurements of the electrical properties of silicon films grown heteroepitaxially on $Al_2O_3$ (sapphire) substrates have shown that the electrical properties are anisotropic in the plane of the film. By this we mean that the electron mobility (as deduced from a Hall effect and resistivity measurement) depends on the measuring current direction. The mobility is determined from the equation $\mu = R_H/\rho$ where $R_H$ is the Hall constant of the material and $\rho$ is the resistivity in the direction of current flow. It is convenient to discuss the amount of anisotropy in terms of an anisotropy parameter A, defined as $A = (\mu_{max} - \mu_{min})/\mu_A$ where $\mu_A = (\mu_{max} + \mu_{min})/2$, and $\mu_{max}$ and $\mu_{min}$ are the maximum and minimum mobilities in the plane, respectively. The amount of anisotropy is found to depend on the crystallographic plane of the Si parallel to the substrate and also on the crystallographic plane of the $Al_2O_3$ substrate. These anisotropic properties result (all or in part) from the fact that the electrical mobility in the film is dependent on the stress in the film (piezoresistance effect).

It is well known that a heteroepitaxial film of Si-on-sapphire grown by chemical vapor deposition (CVD) techniques is in a state of compressive stress due to the difference in thermal contraction between the sapphire and the Si. This stress develops when the film is cooled from the growth temperature (typically 1000°–1200°C) to room temperature after growth.

In the paragraphs that follow, the origin of the stresses and strains and how these effect the electrical properties will be examined theoretically. A discussion of the experimental results on selected planes in the $Si/Al_2O_3$ system will be given, followed by a discussion of possible techniques for improving device performance by utilizing these effects.

Origin of Stress and Strain in Silicon Heteroepitaxial Films

Stress and strain in Si heteroepitaxial films is believed to arise from lattice mismatch between film and substrate and from differences in thermal expansion coefficients between film and substrate. The first stress-strain mechanism— that due to lattice mismatch— is believed small since the films are grown at elevated temperatures and the lattice mismatch can be relieved by the generation of dislocations. High dislocation densities in Si films have indeed been observed, consistent with this assumption.

Differences in thermal expansion coefficients produce elastic stress and strain in Si films and are believed to account for the bulk of the total elastic stress or strain present at room temperature in Si films and devices. Comparison of theoretical and experimental mobilities indicates that calculations based on the effects of a thermal expansion induced stress are realistic for Si films. We shall therefore indicate briefly how the thermal induced stress arises and can be calculated.

We consider the case of a thin film on a relatively thick substrate. In this case the stress is approximately constant in the direction perpendicular to the film surface and, in addition, effects of stress relief due to bending of the composite are small. The origin of thermal induced stress is that film and substrate are bonded across the interface plane and thus are not completely free to expand or contract. Since thermal expansion is restricted by the boundary between film and substrate, a strain and hence a stress must arise.

The thermal expansion tensor (strain tensor) is a second rank symmetric tensor. Let $\alpha_s =$ the expansion coefficient for Si and let $\alpha_1$ and $\alpha_2$ represent the thermal expansion coefficients perpendicular and parallel to the <0001> axis (or c-axis) respectively for sapphire. The relative thermal expansion between film and substrate is then (for temperature difference $\Delta T$)

$$\begin{pmatrix} \alpha_s 0 0 \\ 0 \alpha_s 0 \\ 0 0 \alpha_s \end{pmatrix} \Delta T - \begin{pmatrix} \alpha_1 0 0 \\ 0 \alpha_1 0 \\ 0 0 \alpha_2 \end{pmatrix} \Delta T = \begin{pmatrix} (\alpha_s - \alpha_1)0 0 \\ 0(\alpha_s - \alpha_1)0 \\ 0 0(\alpha_s - \alpha_2) \end{pmatrix} \Delta T$$

for cartesian coordinate axes which are along the cubic crystal axes in Si. For sapphire, the $x$-axis $\parallel \vec{a}_1$, $y$ axis $= 90°$ to $\vec{a}_1$ and $30°$ to $\vec{a}_2$ while the $z$ axis is $\parallel$ to the $Al_2O_3$ c-axis. ($\vec{a}_1$, $\vec{a}_2$, and $\vec{a}_3$ are the unit vectors of a hexagonal lattice in the {0001} plane). For convenience we shall switch from the above tensor notation to the so-called engineering strains $\epsilon_1$, $\epsilon_2$, $\epsilon_3$, $\epsilon_4$, $\epsilon_5$, $\epsilon_6$. In this contracted notation (quasi-vector) $\epsilon_1 = (\alpha_s - \alpha_1)\Delta T$, $\epsilon_2 = (\alpha_s - \alpha_1)\Delta T$, $\epsilon_3 = (\alpha_s - \alpha_2)\Delta T$, $\epsilon_4 = 2\epsilon_{23} = 0$, $\epsilon_5 = 2\epsilon_{13} = 0$, and $\epsilon_6 = 2\epsilon_{12} = 0$.

For application to the $Si/Al_2O_3$ system we shall require the thermal expansions for an arbitrary film/substrate orientation. Let $x'y'z'$ represent a new set of cartesian axes with $z'$ the normal to the substrate plane and $x'$ and $y'$ in the plane. The coordinate transformation matrix is then $$\begin{pmatrix} x' \\ y' \\ z' \end{pmatrix} = \begin{pmatrix} L_1 M_1 N_1 \\ L_2 M_2 N_2 \\ L_3 M_3 N_3 \end{pmatrix} \begin{pmatrix} x \\ y \\ z \end{pmatrix}$$

where $L_1$ $M_1$ and $N_1$ are the direction cosines of the $x'$ axis, $L_2$ $M_2$ and $N_2$ are direction cosines of the $y'$ axis, and $L_3$ $M_3$ and $N_3$ are direction cosines of the $z'$ axis, all with respect to the $xyz$ axes.

With the use of the transformation matrix, the strain tensor can be transformed to the coordinate system appropriate to an arbitrary plane. The results of this transformation, in terms of the engineering strains, are given by $$\epsilon_1' = (1 - N_1^2)\epsilon_1 + N_1^2 \epsilon_3$$

$$\epsilon_2' = (1 - N_2^2)\epsilon_1 + N_2^2 \epsilon_3$$

$$\epsilon_3' = (1 - N_3^2)\epsilon_1 + N_3^2 \epsilon_3$$

$$\epsilon_4' = -2N_2N_3(\epsilon_1 - \epsilon_3)$$

$$\epsilon_5' = -2N_1N_3(\epsilon_1 - \epsilon_3)$$

$$\epsilon_6' = -2N_1N_2(\epsilon_1 - \epsilon_3)$$

We emphasize that the above represent relative thermal expansions and do not all result in thermal strains in the film-substrate composite.

We will now indicate how strain and stress arise in the film. The film and substrate are constrained only in the $x'$ and $y'$ coordinate directions. Thus the thermal expansions $\epsilon_1'$, $\epsilon_2'$ and $\epsilon_6'$ given above are to be regarded as applied thermal strains. There are no other components of applied thermal strain since the materials are free to expand in these other directions. However, these three components of thermal strain act essentially through Poisson type effects, to produce reaction strains $\epsilon_3'$, $\epsilon_4'$ and $\epsilon_5'$.

Let $T_1'$, $T_2'$, $T_3'$, $T_4'$, $T_5'$, $T_6'$ represent engineering stresses and let $c_{ij}'$ represent a matrix of elastic constants for Si, all for the arbitrary plane and coordinate system described above. There the stress is given in terms of the strain by $$\begin{pmatrix} T_1' \\ T_2' \\ T_3' \\ T_4' \\ T_5' \\ T_6' \end{pmatrix} = \begin{pmatrix} c_{11}' & c_{12}' & c_{16}' \\ c_{21}' & c_{22}' & \\ c_{31}' & & \\ & & \\ & & \\ c_{61}' & & c_{66}' \end{pmatrix} \begin{pmatrix} \epsilon_1' \\ \epsilon_2' \\ \epsilon_3' \\ \epsilon_4' \\ \epsilon_5' \\ \epsilon_6' \end{pmatrix}$$

where $\epsilon_1'$, $\epsilon_2'$, $\epsilon_6'$ are applied thermal strains and $\epsilon_3'$, $\epsilon_4'$, $\epsilon_5'$ are Poisson reaction strains to be determined by boundary conditions. The Si film surface is a free surface and must have no stresses on the $z'$ surface. Thus $T_3'$, $T_4'$, $T_5'$ are all zero at the free surface. Since the film is thin, we assume the stresses are approximately constant in the $z'$ direction. Continuity then allows us to set these three stresses to zero throughout the Si film. The elastic constants $c_{ij}'$ can be determined from the basic elastic constants for Si by transforming the elastic constant matrix.

The elastic constant matrix is derived from a 4th rank symmetric tensor and its transformation is long and tedious and will not be given here. Assuming the $c_{ij}'$ to be known, the reaction strains can be determined by matrix inversion. With these known, the thermal expansion stresses $T_1'$, $T_2'$ and $T_6'$ can be determined.

Calculated results are given below for the {001} Si plane on {01$\bar{1}$2} Al$_2$O$_3$. Using $\alpha_s = 3.9 \times 10^{-6}$/°C $\alpha_1 = 8.31 \times 10^{-6}$/°C and $\alpha_2 = 9.03 \times 10^{-6}$/°C, and $\Delta T = 1100$°C and the known elastic constants of Si, the stresses $T_1'$ and $T_2'$ (along the $x'$ and $y'$ directions on the film) and $T_6'$ are given by $$\frac{T_1' + T_2'}{2} = 8.9675 \times 10^{11} [1.2869 \, \epsilon_1 + 0.71302 \, \epsilon_3] \approx -0.9206 \times 10^{10} \text{ dynes/cm}^2$$

$$\frac{T_1' - T_2'}{2} = 3.6007 \times 10^{11} [\epsilon_1 - \epsilon_3] \approx +0.2592 \times 10^9 \text{ dynes/cm}^2$$

$$T_6' = 0.$$

The {001} Si plane is an example of a case where the stress would be uniform ($T_1' = T_2'$) in the plane if $\epsilon_1 = \epsilon_3$, i.e., $\alpha_1 = \alpha_2$. Thus the anisotropy in planar stresses in the film is directly proportional to the anisotropy in thermal expansion of the substrate. The anisotropy in stress in the {111} Si plane is also a result of an anisotropy in thermal expansion of the substrate. For any other plane, however, a stress anisotropy will in general result, even for a substrate with isotropic thermal expansion.

Relation Between Stress and Electronic Properties

We have indicated how the elastic stress due to thermal expansion mismatch arises and can be calculated. Some attention over the years has been devoted to attempts to reduce this stress by modifying the interfacial transition region; all without success. The stress is inherent in composite systems and must be accepted. The important question concerns the effect of the stress on electronic properties such as mobility and resistivity. The effect on these two properties can be described by means of the piezoresistance effect. This effect relates electric field $E$, current density $j$, resistivity $\rho$, stress $T$, and the piezoresistance tensor $\pi$. In tensor notation we have $$E_i = \rho_{ij} j_j + \pi_{ijkl} \, j_j \, T_{kl}$$

where for silicon $\rho$ is diagonal. $\pi$ is a fourth rank tensor and in general is not symmetric. The tensor $\pi$ is generally contracted to a matrix. With reference to the crystallographic axes the matrix in the contracted two-subscript notation is (for silicon)

$$\begin{pmatrix} \pi_{11} & \pi_{12} & \pi_{12} & 0 & 0 & 0 \\ \pi_{12} & \pi_{11} & \pi_{12} & 0 & 0 & 0 \\ \pi_{12} & \pi_{12} & \pi_{11} & 0 & 0 & 0 \\ 0 & 0 & 0 & \pi_{44} & 0 & 0 \\ 0 & 0 & 0 & 0 & \pi_{44} & 0 \\ 0 & 0 & 0 & 0 & 0 & \pi_{44} \end{pmatrix}$$

This matrix may be obtained for an arbitrary plane and coordinate axes orientations by transformation and will then be denoted by $\pi'$ with coefficients $\pi_{ij}'$. In general none of the coefficients are then required to be zero.

Our primary interest is in the so-called longitudinal piezoresistance effect. In this case one has a single component of current (here along the $x'$-direction in the arbitrary plane) and measures the resistivity along this direction. Thus the piezoresistance equation is (setting the film stresses $T_3'$, $T_4'$, $T_5'$ to zero).

$$E_1'/\rho_0 = j_1'(1 + \pi_{11}' T_1' + \pi_{12}' T_2' + \pi_{16}' T_6').$$

The change in resistance $\Delta \rho / \rho_0$ due to the stress is then given by $$\Delta \rho / \rho_0 = \pi_{11}' T_1' + \pi_{12}' T_2' + \pi_{16}' T_6'$$

where $T_1'$, $T_2'$, and $T_6'$ are the stresses previously calculated and $\rho_0$ is the zero-stress resistivity. The stresses are all functions of orientation, as are the $\pi_{ij}'$ coefficients, and can be written in terms of the direction cosines $L_1 M_1 N_1$, $L_2 M_2 N_2$, $L_3 M_3 N_3$ defining the desired plane and coordinate system. For example, $\pi_{11}'$ is given by $$\pi_{11}' = \pi_{11} - 2(\pi_{11} - \pi_{12} - \pi_{44})[(L_1 M_1)^2 + (M_1 N_1)^2 + (L_1 N_1)^2].$$

The mobility $\mu$(cm$^2$/volt-sec), in terms of the zero-stress mobility $\mu_0$, is given by $$\mu/\mu_0 = \frac{1}{1 + \Delta \rho / \rho_0}.$$

There are other factors which strongly influence the mobility. One which is important in Si epitaxy is the presence of dislocations, which tend to reduce mobility. Thus $\mu_0$ in the above formula would not be expected to relate to bulk-crystal values.

Application of Above Ideas to Si Heteroepitaxy

The fact that stress influences resistivity via the piezoresistance effect is not new, and in fact forms the basis of the Si strain gauge industry. However much less attention has been devoted to Si heteroepitaxial films. In particular we are not aware of any calculations of an anisotropic resistivity or mobility due to an anisotropy in stress. Our theoretical and experimental studies establish (1) that resistivity and mobility are generaly a function of orientation on a given plane and (2) that this anisotropy is a strong function of the particular plane.

In the following discussions we shall document the resistivity and mobility variation by considering a few specific cases and then treating the more general case of off-orientation planes.

We are interested in the magnitude and anisotropy of the piezoresistance effect due to thermal expansion mismatch. The {100} and {111} Si planes are found to display a mobility anisotropy that depends solely and directly upon differences in the substrate thermal expansion coefficients. For the case of either {100} or {111} Si on spinel, or any other substrate with isotropic thermal expansion, the planar anisotropy would vanish. Analytic results for {001} Si on {01$\bar{1}$2} Al$_2$O$_3$ will illustrate the anisotropy in mobility. We have developed a theoretical formalism which yields $$\frac{\Delta\rho}{\rho_0} = \left(\frac{T_1'+T_2'}{2}\right)(\pi_{11}+\pi_{12}) + \left(\frac{T_1'-T_2'}{2}\right)(\pi_{11}-\pi_{12})\cos 2\theta + \pi_{44} T_6' \sin 2\theta$$

where $T_1'$, $T_2'$, $T_6'$ are the applied stresses, and $\theta$ is measured from the <100> Si axis in the plane of the film. (As before the mobility is given by $$\mu/\mu_0 = 1/(1 + \Delta\rho/\rho_0).$$

For this case the stresses are found to be $$\frac{(T_1'+T_2')}{2} = \frac{(c_{11}^2 + c_{11}c_{12} - 2c_{12}^2)}{2c_{11}}[1.287\,\epsilon_1 + 0.713\,\epsilon_3];$$

$$\frac{(T_1'-T_2')}{2} = 0.713\,\frac{(c_{11}-c_{12})}{2}(\epsilon_1-\epsilon_3); \quad T_6' = 0.$$

Thus the anisotropy in mobility depends solely and directly on the anisotropy in substrate thermal expansion $(\epsilon_1-\epsilon_3) = (\alpha_1-\alpha_2)\Delta T$ and would vanish for Si/spinel $(\alpha_1=\alpha_2)$. For n-type {001} silicon we obtain numerically $(\Delta T = 1100°)$ $$\frac{\Delta\rho}{\rho_0} = 0.44192 - 0.04449 \cos 2\theta$$

and $$\frac{\mu}{\mu_0} = 1/(1.44192 - 0.04449 \cos 2\theta)$$

Let us next consider the {221} Si on {11$\bar{2}$2} Al$_2$O$_3$. In this case $$\frac{\Delta\rho}{\rho_0} = \left(\frac{T_1'+T_2'}{2}\right)\left\{(\pi_{11}+\pi_{12}) - (\pi_{11}-\pi_{12}-\pi_{44})\frac{4}{27}(2+\cos 2\theta)\right\}$$

$$+ \left(\frac{T_1'-T_2'}{2}\right)\left\{(\pi_{11}-\pi_{12})\cos 2\theta - (\pi_{11}-\pi_{12}-\pi_{44})\frac{1}{27}(4+11\cos 2\theta)\right\}$$

$$+ T_6'\left\{(\pi_{11}-\pi_{12})\sin 2\theta - (\pi_{11}-\pi_{12}-\pi_{44})\frac{8}{9}\sin 2\theta\right\}$$

where $\theta$ is now measured from the <1$\bar{1}$0> axis in the plane of the Si, and $$\frac{(T_1'+T_2')}{2} = [22.338\,\epsilon_1 - 9.226\,(\epsilon_1-\epsilon_3)] \times 10^{11}\,\text{dynes/cm}^2$$

$$\frac{(T_1'-T_2')}{2} = [1.4106\,\epsilon_1 + 4.6432\,(\epsilon_1-\epsilon_3)] \times 10^{11}\,\text{dynes/cm}^2$$

$$T_6' = 0.$$

For N-type {221} Si we obtain $$\frac{\Delta\rho}{\rho_0} = 0.0637 - 0.2189 \cos 2\theta$$

and $$\frac{\mu}{\mu_0} = 1/(1.0637 - 0.2189 \cos 2\theta).$$

The general form of the mobility, viz., $\mu/\mu_0 = 1/(a + b \cos 2\theta)$ appears to be a general result, and has been found for all planes and orientations we have considered for Si. Note that the constant $(a)$ determines primarily the amount of mobility reduction (or enhancement) due to the stress, while $(b)$ determines the amplitude of the variation of mobility in the plane. The anisotropy factor defined earlier can then be written as $A = 2b/a$, in terms of these constants. For any given plane, the mobility will be a maximum when the quantity $(a + b \cos 2\theta)$ assumes a minimum value.

The {001} Si and {221} Si cases detailed above are quite different numerically and illustrate the main features of piezoresistance for Si. For {001} Si the maximum mobility $(\theta = 0°)$ would be $\mu = 0.715\,\mu_0$. On the other hand, at $\theta = 0°$, the maximum mobility for {221} Si would be $\mu = 1.18\,\mu_0$ wich represents a mobility enhancement. This general characteristic is borne out in our laboratory in that, generally speaking, the best {221} mobilities have been higher than the best {001} mobilities.

Experimental Studies

Although the experimental investigation of the mobility anisotropy in all planes of interest has not been completed, detailed studies in the {001} Si/{01$\bar{1}$2} Al$_2$O$_3$ and {221} Si/{11$\bar{2}$2} Al$_2$O$_3$ system have been made. These results serve to verify the general conclusions of the theory, and show that considerable differences in mobility can result in a given Si plane.

For the studies described below, Si films approximately 2μm thick were examined. The films were grown at a temperature of from 1050° to 1100°C (although the same effects can be observed for a much wider range of growth temperature) and were doped n-type with a net donor concentration between $10^{16}$–$10^{7}$cm$^{-3}$. (The effects of carrier concentration on the piezoresistance is small for concentrations less than approximately $10^{17}$cm$^{-3}$ but become larger for higher carrier concentrations (>$10^{17}$) due to the dependence of the $\pi$ coefficients on concentration).

The Hall mobility shows an experimental anisotropy of nearly 10% in the {100} Si plane when grown on the {01$\bar{1}$2} Al$_2$O$_3$. The maximum mobility occurs along or near the <100> Si direction in the plane of the film. The <100> Si is found to be parallel to the <2$\bar{1}\bar{1}$0> Al$_2$O$_3$ direction. As discussed previously, the mobility varies in the plane according to the formula $\mu/\mu_o = 1/(a+b \cos 2\theta)$, where a and b are constants equal to 1.4419 and −0.0445 respectively. The predicted anisotropy (2b/a) of ≈6% agrees fairly well with the experimental values.

The experimental anisotropy observed in the {221} Si/{11$\bar{2}$2} Al$_2$O$_3$ is found to be much larger than the 100 Si plane, and averages approximately 39% for the samples investigated.

The variation of mobility in the plane is given theoretically by $\mu/\mu_o = 1/(a+b \cos 2\theta)$ with $a = 1.06375$ and $b = -0.21891$. For this plane $\theta$ is measured from the <1$\bar{1}$00> Al$_2$O$_3$ axis or the <110> Si axis, along which the mobility assumes a maximum value. It can be seen that for a range of angles around the <110> Si axis the mobility is seen to be greater than the unstressed mobility $\mu_o$. The predicted anisotropy of 41% agrees well with experiment.

Growth of Off-Axis Films to Maximize Mobility

Although the predicted mobility anisotropies are comparatively small for {111} or {100} Si growth on Al$_2$O$_3$ it may be possible to increase the anisotropy in an advantageous way by growing the Si film off the {100} or {111} plane. Although detailed calculations have not been carried out for all planes, there are indications that the anisotropy increases markedly as the normal to the film moves off of the high symmetry direction, i.e., the Si film is no longer the {100} or {111} plane.

We have developed general formulae for three families of off-orientation planes. Reasonable estimates of the mobility anisotropy for the case of a substrate with isotropic thermal expansion (but which is approximately applicable for many planes of Si) can be obtained by considering only the various terms in $(T_1'+T_2')/2$ and neglecting $(T_1'-T_2')/2$ and $T_6'$. Three general sets of types of planes have been considered in the above isotropic stress approach.

The first type of plane is of the form {11X} and encompasses planes lying between {110}, {221} and {111}. We obtain $$\frac{\Delta\rho}{\rho_o} = \left(\frac{T_1'+T_2'}{2}\right)\left\{(\pi_{11}+\pi_{12})-(\pi_{11}-\pi_{12}-\pi_{44})\frac{1}{(2+x^2)^2}[1+2x^2+(1-x^2)\cos 2\theta]\right\}$$

where $\theta$ is measured from the <110> in the plane. The second type of general plane is of the form 1, X, 0 and includes planes lying between 110 and 110 Si planes. We obtain.

$$\frac{\Delta\rho}{\rho_o} = \frac{(T_1'+T_2')}{2}\left\{(\pi_{11}+\pi_{12})-(\pi_{11}-\pi_{12}-\pi_{44})\frac{x^2}{(1+x^2)^2}[1-\cos 2\theta]\right\}$$

where $\theta$ is measured from the <001> axis in the plane. The final type of plane investigated is of the form {XX1} and encompasses planes between {001}, {111}, {221}. We obtain $$\frac{\Delta\rho}{\rho_o} = \frac{(T_1'+T_2')}{2}\left\{(\pi_{11}+\pi_{12})-(\pi_{11}-\pi_{12}-\pi_{44})\frac{x^2}{(1+2x^2)^2}[(2+x^2)-(1-x^2)\cos 2\theta]\right\}$$

where $\theta$ is again measured from the <110> axis in the plane. These three equations are important in that they allow resistivity and mobilities for off-orientation planes to be estimated.

Note that these equations are all of the general form $\mu/\mu_o = 1/(a+b \cos 2\theta)$, and that the constants $(a)$ and $(b)$ depend on the parameter $x$.

It therefore may be possible to increase the anisotropy a desired amount by growing a Si film whose orientation is off the high symmetry plane. This may be accomplished by choosing a suitably oriented substrate. In addition to changing the amount of anisotropy by growing Si off of a high symmetry plane, the constant amount by which the mobility is changed by stress may also be lowered, thus leading to a higher average mobility.

The growth of a non-symmetry plane of Si may then yield a film in which there may be directions along which the mobility is much higher than that found in the symmetry planes of Si. As an example, if we consider the {111} Si plane in the above isotropic stress approximation, the mobility $\mu/\mu_o \approx 1.0$, and is isotropic ($\mu_o$ = unstressed mobility). If we now consider a film whose plane is approximately 6° off the {111} Si plane (in a direction toward the {110} Si plane), the maximum mobility becomes $\mu/\mu_o = 1.08$. Hence the 6° rotation has led to a film which contains directions along which the mobility has increased by 8%.

At the present time {100} Si/ {01$\bar{1}$2} Al$_2$O$_3$ is presently used almost entirely in the device industry. Although an enhancement in device performance can be expected by orienting the device as discussed above, a further enhancement may well be expected by using an Al$_2$O$_3$ substrate slightly off the {01$\bar{1}$2} Al$_2$O$_3$ plane so that the Si overgrowth will be off the {100} plane. Of course, other effects related to such things as the dislocation density or surface state density may modify the mobility advantages to a certain extent.

EXAMPLES

The following examples are representative of single crystal semiconductor films deposited on substrate material in accordance with this invention.

Example 1

When {001} Si is deposited on {01$\bar{1}$2} Al$_2$O$_3$, the direction of maximum mobility is along the <100> Si direction which is parallel to the <2$\bar{1}\bar{1}$0> Al$_2$O$_3$ direction.

Example 2

When {111} Si is deposited on {10$\bar{1}$4} Al$_2$O$_3$, the direction of maximum mobility is along the <1$\bar{1}$0> Si direction which is parallel to the <1$\bar{2}$10> Al$_2$O$_3$ direction.

Example 3

When {221} Si is deposited on {1$\bar{1}$22} Al$_2$O$_3$, the direction of maximum mobility is along the <1$\bar{1}$0> Si direction which is parallel to the <1$\bar{1}$00> Al$_2$O$_3$ direction.

Examples 1-3 illustrate the maximum mobility directions for the high symmetry planes in Si. The following examples are illustrative of the anisotropy in the mobility in planes other than those of high symmetry.

Example 4

Any arbitrary plane of Si grown on an arbitrary plane of Al$_2$O$_3$ will in general possess an anisotropy in mobility and a direction of maximum mobility. An example of such an arbitrary plane of Si may be described as {XX1} Si, where $0 \leq X \leq 2$, and encompasses planes between {001}, {111}, and {221} Si planes.

Example 5

Any arbitrary plane of Si grown on an arbitrary plane of spinel, excluding the {100} Si and {111} Si planes and their corresponding substrates of spinel, will in general possess an anisotropy in mobility and a direction of maximum mobility.

The physical phenomena herein discussed occur in both N and P type piezoresistive semiconducting films. The theoretical formation is also applicable to both N and P type materials, but the numerical data given have been for N type silicon films. It is to be understood, however, that P type silicon and other piezoresistive semiconductors can be equally effectively used.

The principles herein stated, are not limited to only MOS type devices shown in the several figures. Any type of semiconductor device whose performance characteristics depend upon carrier mobility, is intended to be included within the confines of this invention.

The discussion preceding has been directed toward the Si-on-sapphire system although the effect of mobility anisotropy and the resultant possibility of improved device performance are applicable to many other semiconductor heteroepitaxial systems. The general requirements for such effects to exist are (1) there must be a difference in thermal expansion coefficient between the film and substrate and the film must be grown at a temperature other than room temperature (or at a temperature other than at which the device will operate) so that a stress will be present in the film, and (2) the film must be piezoresistive, i.e., the electrical properties of the semiconducting film must depend on the stress in the film.

The magnitude of the effect on mobility of course depends on many factors, most of which were discussed in previous paragraphs. These would include, for example, the size of the piezoresistance coefficients, the difference in thermal expansion coefficient, the temperature difference $\Delta T$ between the growth temperature and the final temperature, etc. These factors must be examined for each system under consideration in order to estimate the size of the effect. Some examples of other systems where effects of the type discussed above may be expected are Si-on-spinel, Ge-on-Al$_2$O$_3$, and Ge-on-spinel.

There are also a large number of other types of devices than the one mentioned above where the above effects may be advantageous. An example is the use of Si-on-Al$_2$O$_3$ as a magnetic field detector by means of the Hall effect. Thin film "Hall" detectors are quite often used for magnetic field sensors; the efficiency of the device depends on the film mobility.

Orientation of Device Structures on Films

The importance of the above effects, which have practical application, is that any device, whose performance depends on carrier mobility and that is formed in a Si heteroepitaxial film, may be improved by orienting the device on the film so that the current direction in the device corresponds to the high mobility direction in the film. In this way the device performance may be optimized over what would be obtained by a random orienting of device structures.

As an example, suppose we would like to optimize the performance of an MOS transistor device on {001} Si/{01$\bar{1}$2} Al$_2$O$_3$. The first step in the process may be done by locating the <2$\bar{1}\bar{1}$0 axis in the plane of the sapphire substrate by appropriate x-ray techniques. The location of this axis could be recorded by say, cutting the edge off of the substrate parallel to the <2$\bar{1}\bar{1}$0> axis. A Si film grown on this substrate (either before or after cutting) will be aligned so that the high mobility <100> Si axis is parallel to the <2$\bar{1}\bar{1}$0> Al$_2$O$_3$ axis.

The procedure for forming a device may involve several photolithographic masking steps which define the components of the device. Considering an MOS transistor shown in FIG. 3 in this device an n-type channel is formed during device operation between the n+ source and drain along the surface of the p-type Si film. It would be desirable to locate the source and drain on the film so that the channel direction lies in the direction of the <100> Si axis parallel to the <2$\bar{1}\bar{1}$0> Al$_2$O$_3$ axis, as shown in FIG. 2.

Figure 2:
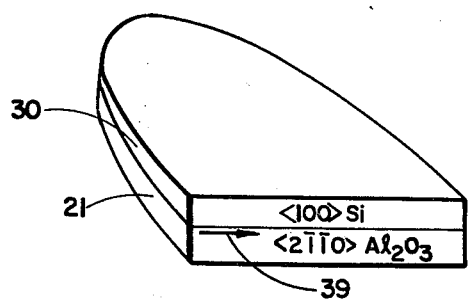
FIG. 2 shows a perspective view of the selected plane of substrate material utilized as a substrate base wherein an edge of the sapphire material has been removed in accordance with a determination of the direction of high carrier mobility, wherein the removed edge is indicative of high carrier mobility direction. This figure also illustrates a film of semiconductor material that had been epitaxially disposed upon a major surface of the substrate.

The diffusion of a suitable donant is carried out in the p-type film to form the source and drain as shown in FIG. 2. The cut edge of the sapphire wafer could be used as the reference to align the photolithographic masks in the desired direction. Hence referring to FIGS. 1, 2 and 3, high symmetry planes of film on substrate are achieved in order to obtain orientation of semiconductor devices formed in the film which are positioned in a direction so that the current flow in the device is in the direction of highest carrier mobility. A cylinder of sapphire 10 is sliced at a preselected angle to obtain a planar member 20. The direction of the highest carrier mobility may be predetermined by known x-ray techniques, and a film of silicon which is heteroepitaxially formed on the substrate material, will have a direction of highest carrier mobility. Hence member 20 is sliced so as to remove edge 22 leaving the remainder of the substrate material 21. The edge thus cut, represents the direction of highest carrier mobility, and hence will represent the direction in which the channel of the MOS device will be oriented within the semiconductor film. Therefore, when deposition of semiconductor material film 30, such as silicon upon substrate 21 occurs, the film will be ready for subsequent processing steps, well-known in the art, to form therein the referred to MOS or other semiconductor device.

Figure 3:
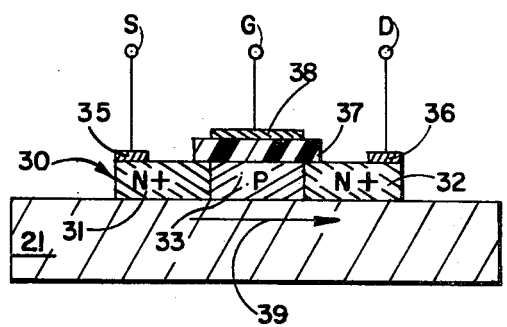
FIG. 3 is a cross-sectional view which represents a MOS semiconductor device after it had been formed in the film and oriented therein in accordance with this invention.

FIG. 3 shows a completed MOS device wherein substrate 21 has attached thereto film 30 in which N+ conductivities 31 and 32 are formed, as well as formation of P type conductivity zone 33. Since the film material 30 is silicon, silicon dioxide layer 37 is formed on top of zone 33. Region 31 will have attached thereto a metallic film 35 and is connected to an external lead to act as the source S of this device, whereas region 32 will have a metallic film 36 attached thereto to which a lead will be connected so as to serve as drain D of this device. Metallic film 38 is attached to layer 37 and a lead is attached to film 38 to serve as gate G of this device.

Therefore, as provided by this invention, the device thus formed will, for high symmetry planes of semiconductor films lie in the direction of highest carrier mobility as indicated by arrow 39.

Figure 4:
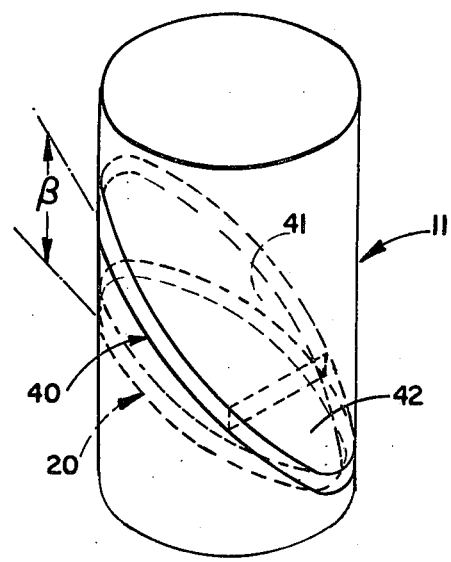
FIG. 4 is a perspective view which represents a similar cylinder of substrate material from which a planar slice is cut at an angle displaced from the angle of the substrate material as in FIG. 1. This substrate base is selected to enable deposition of films on this substrate, the surface of which is a plane other than a high symmetry crystallographic plane, normally referred to as off-axis symmetry.
Figure 5:
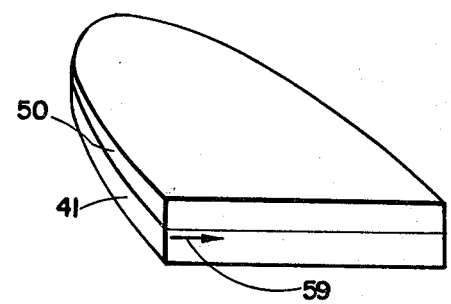
FIG. 5 shows a perspective view of the a film deposited on the substrate to obtain the off-axis symmetry plane.
Figure 6:
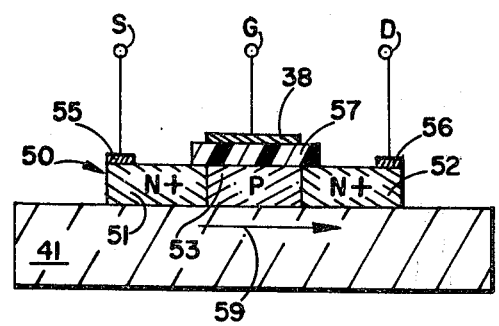

Referring to FIGS. 4, 5 and 6, certain types of film and substrate combinations provide better performance when off-axis symmetry films are utilized in order to maximize the carrier mobility as hereinabove described in prior sections of this specification. Therefore, using orientation of film 20 as a reference plane in cylindrical substrate material 11, a planar member 40 selected at an angle $\beta$ with respect to member 20, is chosen for use as substrate material. Again, once the plane of the substrate had been selected, the direction of highest carrier mobility is defined by removing an edge 42 from planar member 40, thereby leaving substrate 41, the edge indicates the direction of highest carrier mobility, in this case, in an off-high symmetry plane.

Semiconductor 50 is a heteroepitaxially disposed film on substrate 41 in readiness for formation of the semiconductor device in the film in accordance with well-known processes.

In FIG. 6 a device is shown to have been formed in film 50 and is oriented in direction 59. Film 50 is attached to substrate 41, and in this film N+ conductivity regions 51 and 52 are formed by methods well-known in the art. Likewise, P region 53 is also formed by equally well-known methods. Since film 50 is of silicon, a silicon dioxide layer 57 is formed over region 53, and a metallic layer 58 is attached to layer 57 in order to enable a gate-lead connection G to be made to layer 58. Likewise, metallic layer 55 is formed over region 51 for enabling a source-lead S to be connected thereto, and a metallic layer 56 is attached to region 52 in order to enable the connection of a drain lead D to be made thereto. The device thus formed will have its maximum carrier mobility in the channel between the source and drain regions in the direction of arrow 59.

We claim:
1. A semiconductor device comprising:
insulating substrate means having a prescribed crystallographic orientation in which an exposed surface displays an anisotropic thermal expansion,
a layer of piezoresistive semiconductive material epitaxially deposited on said exposed surface of said insulating substrate in a preferred crystallographic orientation so that said layer is maintained in an anisotropically stressed condition by said substrate means and exhibits a changed average mobility and a preferred direction of mobility of charge carriers therein, and
at least one region of semiconductor material of said device being located in said layer and oriented so that current passes therethrough in the preferred direction of mobility established in said layer, wherein the substrate is sapphire and has its ($1\overline{1}22$) plane exposed and said semiconductor film has its (221) crystallographic face exposed.

* * * * *